(12) United States Patent
Shah et al.

(10) Patent No.: US 7,514,791 B2
(45) Date of Patent: Apr. 7, 2009

(54) HIGH RELIABILITY MULTILAYER CIRCUIT SUBSTRATES

(75) Inventors: Rajiv Shah, Rancho Palos Verdes, CA (US); Shaun Pendo, Santa Maria, CA (US)

(73) Assignee: Medtronic Minimed, Inc., Northridge, CA (US)

( * ) Notice: Subject to any disclaimer, the term of this patent is extended or adjusted under 35 U.S.C. 154(b) by 0 days.

(21) Appl. No.: 11/030,235

(22) Filed: Jan. 6, 2005

(65) Prior Publication Data

US 2005/0146039 A1 Jul. 7, 2005

Related U.S. Application Data

(60) Division of application No. 10/671,996, filed on Sep. 26, 2003, now Pat. No. 7,138,330, which is a continuation-in-part of application No. 10/331,186, filed on Dec. 26, 2002, now abandoned.

(60) Provisional application No. 60/414,289, filed on Sep. 27, 2002.

(51) Int. Cl.
 *H01L 23/48* (2006.01)
(52) U.S. Cl. ...................... 257/758; 257/750
(58) Field of Classification Search .................. 257/750, 257/758
 See application file for complete search history.

(56) References Cited

U.S. PATENT DOCUMENTS

| 5,451,804 | A  | * | 9/1995 | Lur et al. ..................... 257/330 |
| 6,184,477 | B1 | * | 2/2001 | Tanahashi ................... 174/261 |
| 6,458,686 | B1 | * | 10/2002 | Piao ............................ 438/622 |
| 2003/0022030 | A1 | * | 1/2003 | Chang ........................ 428/701 |
| 2005/0082636 | A1 | * | 4/2005 | Yashima et al. ............. 257/532 |

FOREIGN PATENT DOCUMENTS

| JP | 55-4955 | 1/1980 |
| JP | 61-111598 | 5/1986 |
| JP | 3-120791 | 5/1991 |
| JP | 6-13723 | 1/1994 |
| JP | 8-31932 | 2/1996 |
| WO | WO 03/023388 A1 | 3/2003 |

OTHER PUBLICATIONS

Office Action issued on Jul. 15, 2008 from related Japanese patent application 2006-528019.
Dr. J. Prymak; Dr. S. Bhattacharya & Prof. K. Paik—*Fundamentals of Passives: Discrete Integrated, and Embedded* (CH. 11)—Fundamentals of Microsystems Packaging, 2001. None.

(Continued)

*Primary Examiner*—Long Pham
(74) *Attorney, Agent, or Firm*—Foley & Lardner LLP

(57) ABSTRACT

A multilayer circuit substrate for multi-chip modules or hybrid circuits includes a dielectric base substrate, conductors formed on the base substrate and a vacuum deposited dielectric thin film formed over the conductors and the base substrate. The vacuum deposited dielectric thin film is patterned using sacrificial structures formed by shadow mask techniques. Substrates formed in this manner enable significant increases in interconnect density and significant reduction of over-all substrate thickness.

19 Claims, 14 Drawing Sheets

OTHER PUBLICATIONS

T. Remmel; P. Zurcher; M. Kim; M. Miller; M. Raymond; S. Straub; M. Tarabbia; R. Steimle & P. Chu—*Integration of Thin-Film Capacitors and Resistors into ULSI Technology for Wireless Applications*—Passive Compnent Industry, Jan./Feb. 2001.

CH 6—*Thermal Transducers*—Micromachined Transducers Soucebook. None.

J.J. Licari—*Thin and Thick Films* (CH 8)- None.

* cited by examiner

Top

Section

Bottom

Top

40

A                                A'

Section

Bottom

Top

Section

Bottom

Top

Section

Bottom

Top

Section

Bottom

HIGH RELIABILITY MULTILAYER CIRCUIT SUBSTRATES

RELATED APPLICATIONS

This application is a divisional of application Ser. No. 10/671,996 filed Sep. 26, 2003 now U.S. Pat. No. 7,138,330, which is a continuation-in-part of application Ser. No. 10/331,186, filed Dec. 26, 2002 now abandoned, which is in turn claims the benefit of prior filed U.S. Provisional Application Ser. No. 60/414,289 filed Sep. 27, 2002. The entirety of each which are incorporated herein by reference.

This application related to U.S. patent application Ser. No. 10/038,276, filed 31 Dec. 2001, entitled "Sensor Substrate and Method of Fabricating Same," the entirety of which is incorporated herein by reference.

BACKGROUND

1. Field of the Invention

Embodiments of the invention relate to semiconductor device fabrication, and, in particular, to the formation of multilayer wiring substrates on which integrated circuits or discrete devices are mounted.

2. Description of Related Art

A variety of mounting structures are known for electronic circuits. Multi-chip modules and hybrid circuits are typically mounted on ceramic substrates that include metallic conductors for interconnecting the components, and the components are typically sealed within a metal or ceramic casing. Complex hybrid circuits typically require equally complex interconnection structure. In such instances it is common to utilize a multilayer substrate comprised of multiple layers of conductors sandwiched between multiple layers of dielectric material. Multilayer substrates are conventionally fabricated by lamination techniques in which metal conductors are formed on individual dielectric layers, and the dielectric layers are then stacked and bonded together.

Various conventional lamination techniques are known, however each has limitations that restricts its usefulness for producing multilayer substrates. High temperature ceramic co-fire (HTCC) lamination techniques form conductors on "green sheets" of dielectric material that are bonded by firing at temperatures in excess of 1500 degrees C. in a reducing atmosphere. The high firing temperature precludes the use of noble metal conductors such as gold and platinum. As a result, substrates formed by high temperature processing are limited to the use of refractory metal conductors such as tungsten and molybdenum, which have very low resistance to corrosion in the presence of moisture and are therefore not appropriate for use in harsh environments.

Low temperature ceramic co-fire (LTCC) techniques also utilize green sheets of ceramic materials. Low-temperature techniques do not require the use of a reducing atmosphere during firing and therefore may employ noble metal conductors. However the dielectric materials used in low-temperature processes are generally provided with a high glass content and therefore have relatively poor resistance to environmental corrosion, as well as a relatively low dielectric constant and relatively poor thermal conductivity.

Thick film (TF) techniques form multilayer substrates by firing individual dielectric layers and then laminating the layers to form a multilayer stack. However, thick film techniques require the use of relatively thick dielectric layers and thus it is difficult to produce a thin multilayer substrate using thick film techniques. Thick film dielectrics also have relatively low dielectric constants, relatively poor thermal conductivity, and poor corrosion resistance.

In addition to the problems listed above, the conventional lamination techniques cannot use green sheets of less than 0.006 inches in thickness because thinner green sheets cannot reliably survive necessary processing such as drilling or punching of via holes. Also, because the designer has limited control over the thickness of individual green sheets, the number of layers of the multilayer substrate is often limited according to the maximum allowable substrate thickness for the intended application. Thus, where a thin multilayer substrate is desired, lamination techniques generally do not provide optimal results.

In addition, the firing required in the conventional lamination techniques can cause shrinkage in excess of 10% in both dielectric and conductor materials, which can produce distortions that result in misalignment of vias and conductors after firing. While shrinkage effects can be addressed to some extent during design for substrates having a modest interconnect density, the design process is made more time consuming and a significant reduction in yield may occur in applications with higher densities and tighter dimensional tolerances.

The conventional technology is therefore limited by several restrictions. All of the aforementioned techniques are limited with respect to the minimum substrate thicknesses that can be produced, and the various firing requirements of the aforementioned techniques prevent the use of materials that are desirable for circuit structures. All of the aforementioned techniques also suffer from shrinkage during firing that causes alignment problems.

SUMMARY OF THE INVENTION

In accordance with embodiments of the invention, a multilayer circuit substrate is comprised of a base substrate and one or more additional dielectric and conductive thin films formed over the base substrate by vacuum deposition methods. The vacuum deposited dielectric layers are significantly thinner than the dielectric layers used in conventional lamination techniques, allowing for the formation of multilayer circuit substrates that are significantly thinner than those formed by conventional lamination techniques. Because vacuum deposited dielectrics are deposited in an "as-fired" state that undergoes essentially no shrinkage during subsequent processing, yield reduction due to misalignment is significantly reduced or eliminated. In addition, vacuum deposition techniques do not impose limitations on the types of conductors or dielectric materials that may be employed, enabling the use of a wide variety of materials with highly tunable properties. Vacuum deposition techniques also produce hermetic layers that facilitate the production of highly reliable substrates.

In accordance with further embodiments of the invention, deposited dielectrics may be patterned through the use of sacrificial structures that may be removed using highly selective etch chemistry. The sacrificial structures are preferably formed using a high precision shadow mask that allow dielectric patterns to be precisely registered to underlying structures and thus enabling high interconnect densities and narrow dimensional tolerances not achievable by conventional lamination techniques.

In accordance with further embodiments of the invention, patterning techniques such as shadow masking, chemical etch and photoresist lift-off may be used for patterning conductive materials. Conductors may therefore be precisely aligned with underlying structures and formed with linewidths not achievable by conventional lamination techniques.

In accordance with further embodiments of the invention, hermetic vias may be formed in the dielectric base substrate by forming successive thin layers of a conductive material on the sidewalls of a via hole using a dilute conductive ink, followed by formation of a conductive plug using a concentrated conductive ink. The conductive material in the via is then sintered to form a unitary body, producing a hermetic via without shrinkage of the surrounding dielectric.

In accordance with one embodiment of the invention, a multilayer circuit substrate is characterized by a dielectric base substrate having conductors formed thereon, and at least one layer of a patterned vacuum deposited thin film dielectric overlying the conductors. In various implementations, multiple layers of conductors and deposited dielectrics may be used, multiple layers may be formed on both sides of the base substrate, and the base substrate may include hermetic vias. It is preferred that the deposited thin film dielectrics are patterned using sacrificial structures formed by shadow mask deposition.

In accordance with another embodiment of the invention, a multilayer circuit substrate for a multi-chip module or a hybrid circuit is produced. Initially a dielectric base substrate is provided. Conductors are then formed on the base substrate, preferably by patterning of a blanket layer of conductive thin film deposited by a vacuum deposition method. Sacrificial structures are then formed on the base substrate and conductors. The sacrificial structures define areas of the base substrate and conductors that are to be protected during subsequent dielectric deposition. The sacrificial structures are preferably formed by shadow mask deposition. A thin film dielectric layer is then vacuum deposited on the base substrate, the conductors and the sacrificial structures, and the sacrificial structures are removed to leave a patterned deposited thin film dielectric layer on the conductors and the base substrate. Further processing such as forming additional conductor layers and dielectric layers or mounting of an electronic component to the substrate may be performed.

DETAILED DESCRIPTION OF PREFERRED EMBODIMENTS

A preferred embodiment of a method for producing a multilayer circuit substrate is now described in the context of production of a hermetic blood glucose sensor circuit. It should be understood that the processing performed in the preferred embodiment represents one implementation of the invention and that the techniques of the invention have a variety of alternative applications, examples of which are provided after the description of the preferred embodiment.

FIGS. 1a-1h show structures formed during processing in accordance with the preferred embodiment to form a hermetic via in a dielectric base substrate. While the processing of FIGS. 1a-1h illustrates a single via, it will be appreciated that multiple vias may be produced simultaneously using the illustrated techniques.

Figure 1A:
FIGS. 1a, 1b, 1c, 1d, 1e, 1f, 1g and 1h show structures formed during fabrication of a hermetic via in accordance with a preferred embodiment.

FIG. 1a shows a cross-sectional view of a portion of a dielectric base substrate 10. The base substrate is preferably a sheet of 96% purity alumina ($Al_2O_3$) that is pre-fired such that shrinkage will not occur during subsequent processing. The preferred embodiment utilizes a two inch by two inch substrate having a thickness of approximately 0.010 inches.

Figure 1B:
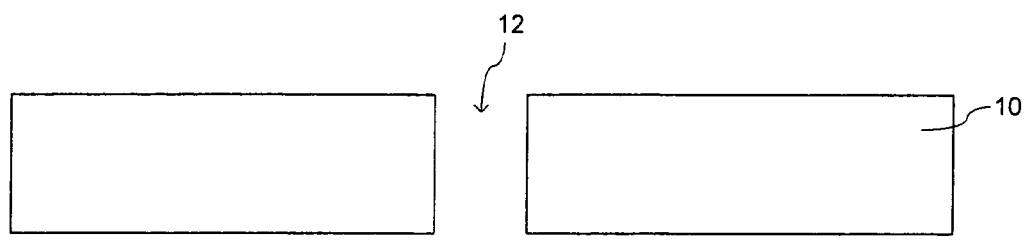

FIG. 1b shows the base substrate of FIG. 1a after laser drilling of a via hole 12. Annealing is preferably performed after laser drilling to reduce imperfections caused during drilling. The use of laser drilling coupled with the techniques described below for precise registration of overlying materials enables the production of ultra-small vias with via densities up to the limits of laser processing. In accordance with the preferred embodiment, vias may be formed with diameters of 0.002 inches and a spacing of 0.006 inches, whereas conventional drilling and tape punch methods as well as shrinkage limit vias produced in HTCC and LTCC substrates to diameters of approximately 0.005 inches and spacings of approximately 0.015 inches.

Figure 1C:
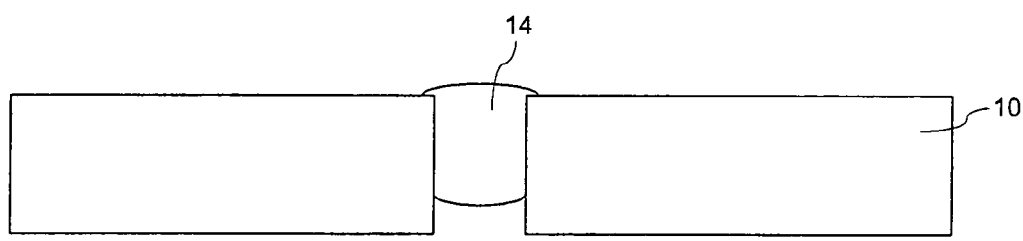

FIG. 1c shows the structure of FIG. 1b after a dilute conductive ink 14 is introduced into the via hole 12 of the base substrate 10. The conductive ink 14 typically comprises a slurry of a particulate noble metal such as gold or platinum suspended in an organic binder that is eliminated during later thermal processing. In accordance with the preferred embodiment, the ink applied to the substrate is diluted from its typical paste-like commercial consistency to a more flowable consistency through mixture with a solvent. The conductive ink 14 is preferably introduced to the via hole 12 by a screen printing technique using a metal screen having apertures corresponding to via holes 12 formed in the base substrate 10. The metal screen is aligned with the base substrate, conductive ink is coated on a surface of the metal screen, and the ink is then forced through the apertures in the screen by dragging with a rubber blade.

Figure 1D:
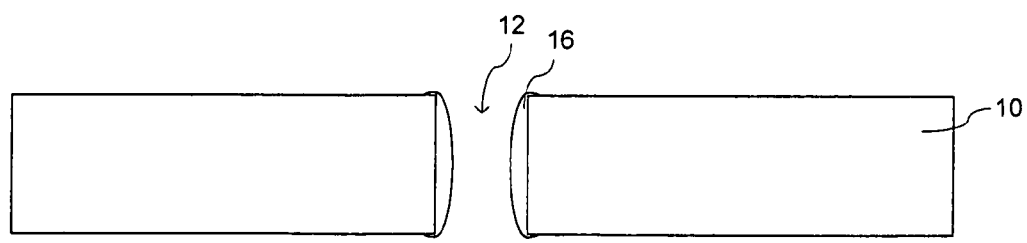

FIG. 1d shows the structure of FIG. 1c after application of a vacuum to the via hole 12. The application of the vacuum causes the conductive ink to form a thin conductive coating 16 that adheres to the sidewalls of the via hole 12 without bubbles or voids. Application of the vacuum is typically followed by low temperature firing in a range of 100-200 degrees C. to remove solvent from the conductive ink, and then by high temperature firing in a range of 850-950 degrees C. to burn out the organic binder from the conductive ink and to fuse the conductive particles.

Figure 1E:
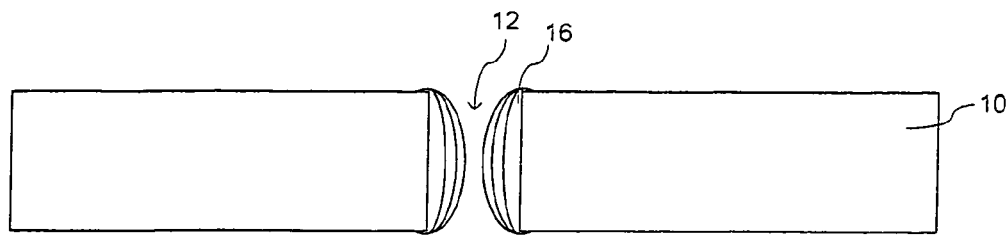

FIG. 1e shows the structure of FIG. 1d after formation of multiple additional thin coats 16 of conductive material on the via hole 12 sidewalls through further applications of dilute conductive ink followed by application of vacuum and firing. As seen in FIG. 1e, each successive layer of conductive material reduces the width of the opening between the sidewalls of the via hole 12.

Figure 1F:
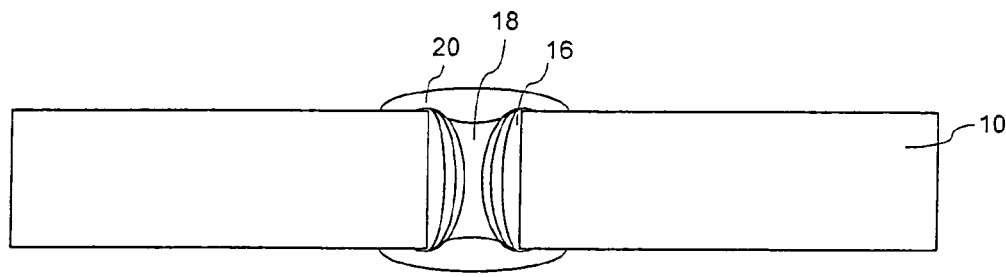

FIG. 1f shows the structure of FIG. 1e after formation of a plug 18 in the via using a conductive ink that is undiluted or substantially less dilute than the ink used for formation of the thin sidewall layers 16. In some instances the formation of the plug may be followed by formation of one or more additional layers 20 of ink to fill any depressions at the ends of the via. The conductive ink is fired after each of these applications.

Figure 1G:
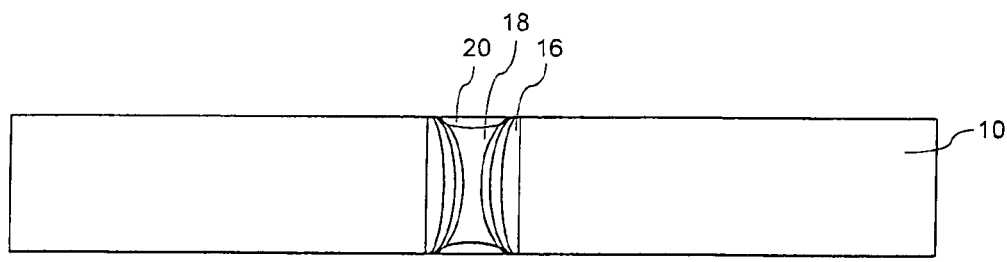

FIG. 1g shows the structure of FIG. 1f after removal of residual conductive material from the surface of the base substrate 10. Residual conductive material is typically removed by a lapping process in which the base substrate 10 is held in a fixed position while an abrasive material is moved against its surface. Lapping may be followed by chemical etching to remove any remaining conductive material from the base substrate surface.

Figure 1H:
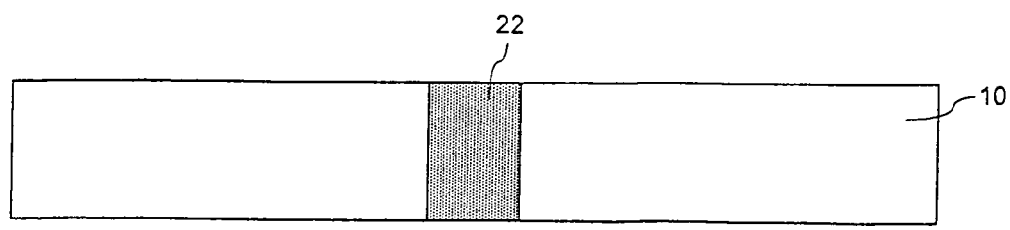

FIG. 1*h* shows the structure of FIG. 1*g* after sintering at a temperature of approximately 1000-1200 degrees C. to bond the individual conductive particles of the conductive ink layers into a monolithic via conductor 22. After sintering, the via is subjected to helium leak testing to confirm the hermeticity of the via.

FIGS. 2*a* through 2*k* show structures formed during processing in accordance with the preferred embodiment for producing a blood glucose sensor using a base substrate having vias formed in accordance with the processing of FIGS. 1*a*-1*h*. Each of FIGS. 2*a* through 2*k* provides a top plan view, a cross-section taken along line A-A' of the top plan view, and a bottom plan view of a section of a substrate upon which processing is performed in accordance with the preferred embodiment.

Figure 2A:
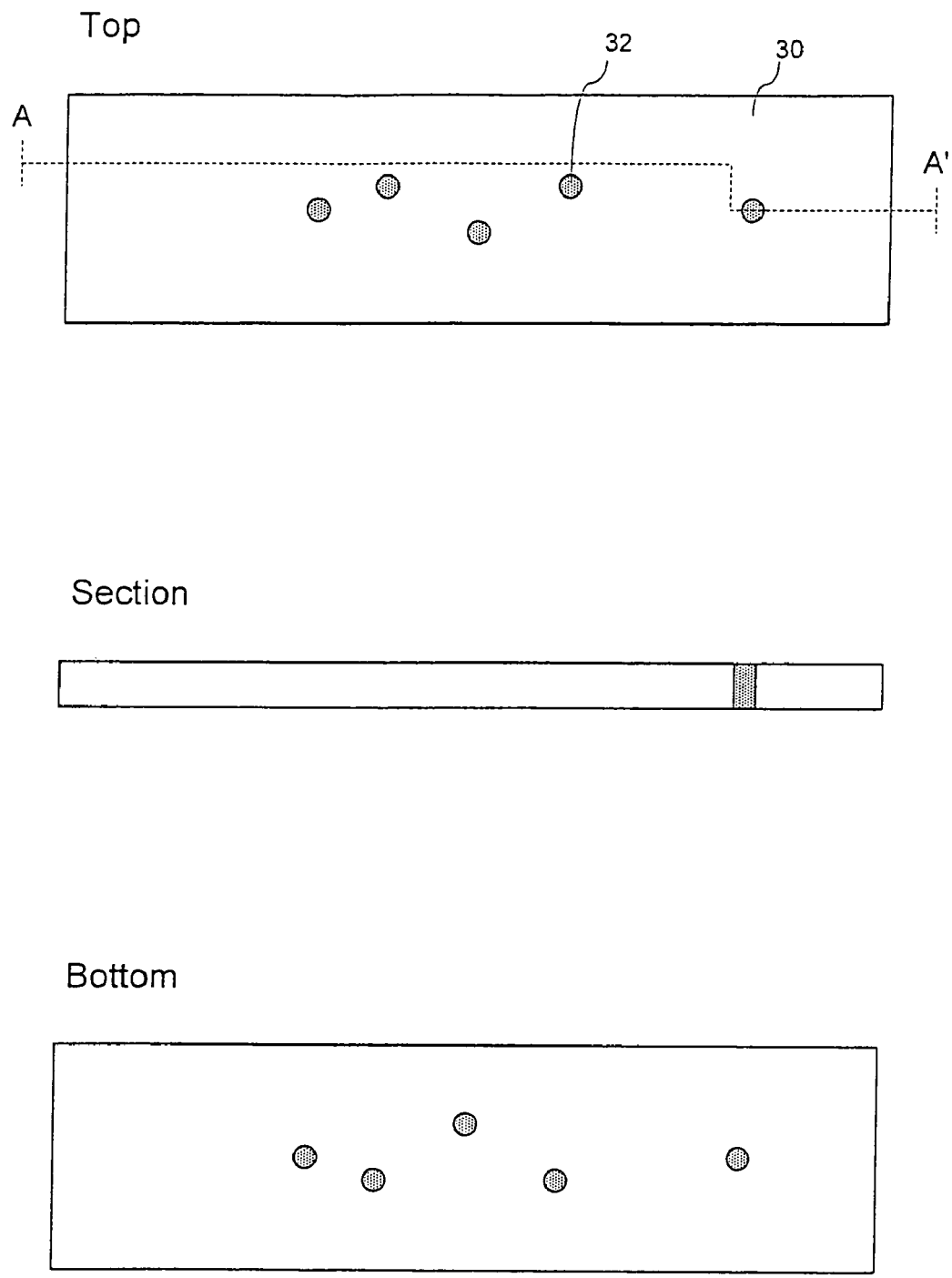
FIGS. 2a, 2b, 2c, 2d, 2e, 2f, 2g, 2h, 2i, 2j and 2k show structures formed during fabrication of a multilayer circuit substrate and circuit structure in accordance with the preferred embodiment.

FIG. 2*a* shows a base substrate 30 having a plurality of hermetic vias 32 extending between its major surfaces. The base substrate 30 is preferably a substrate of the type used in the processing of FIGS. 1*a*-1*h*, and the hermetic vias are preferably formed in accordance with the processing of FIGS. 1*a*-1*h*.

Figure 2B:
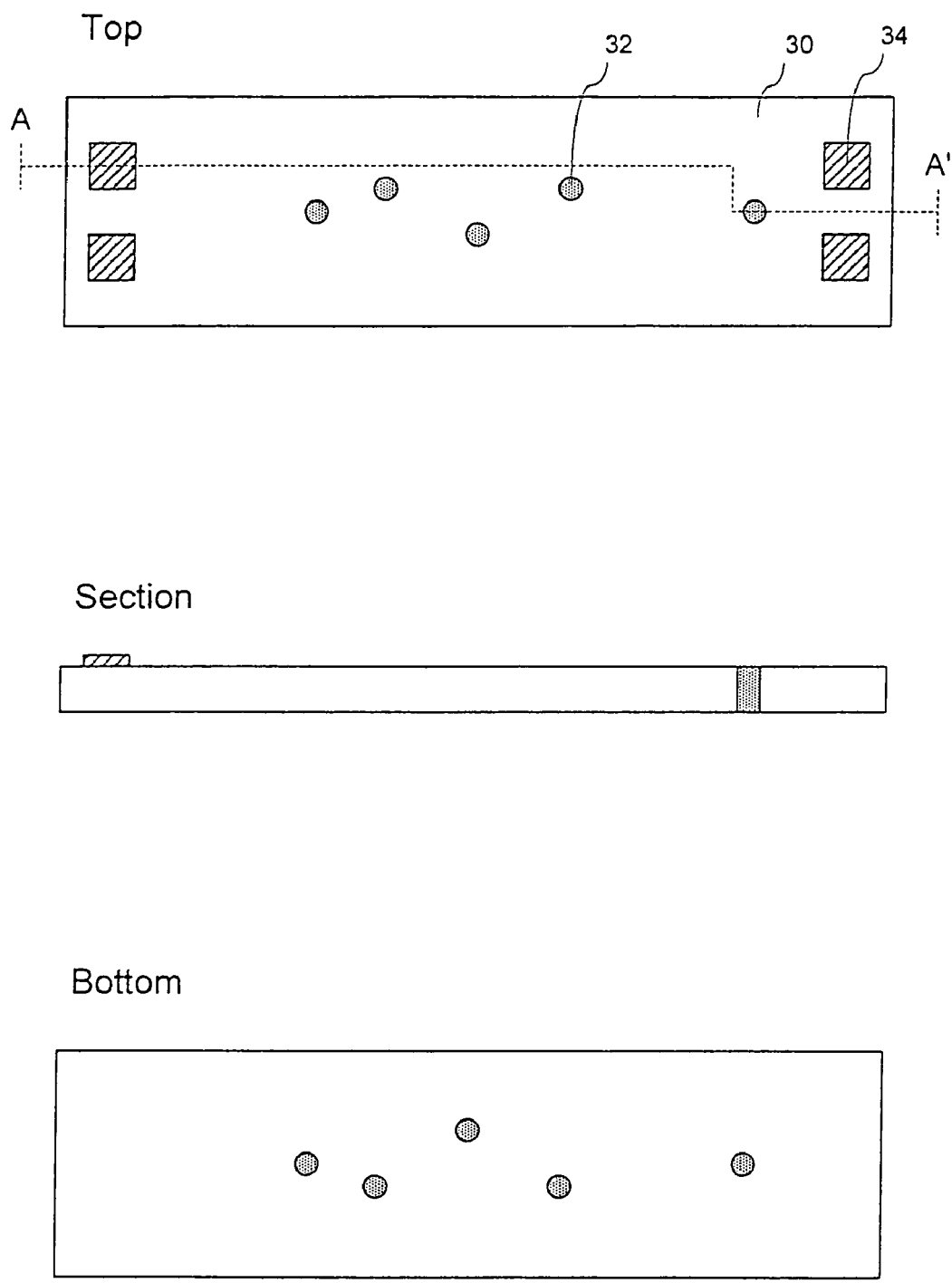

FIG. 2*b* shows the structure of FIG. 2*a* after formation of welding pads 34 on the top surface of the substrate. The welding pads 34 provide connection points for external wires to the circuitry that will be mounted on the substrate. The welding pads of the preferred embodiment are formed by screen printing using a platinum conductive ink, however in alternative embodiments contacts may be formed by other techniques that are consistent with the requirements of the joining process.

Figure 2C:
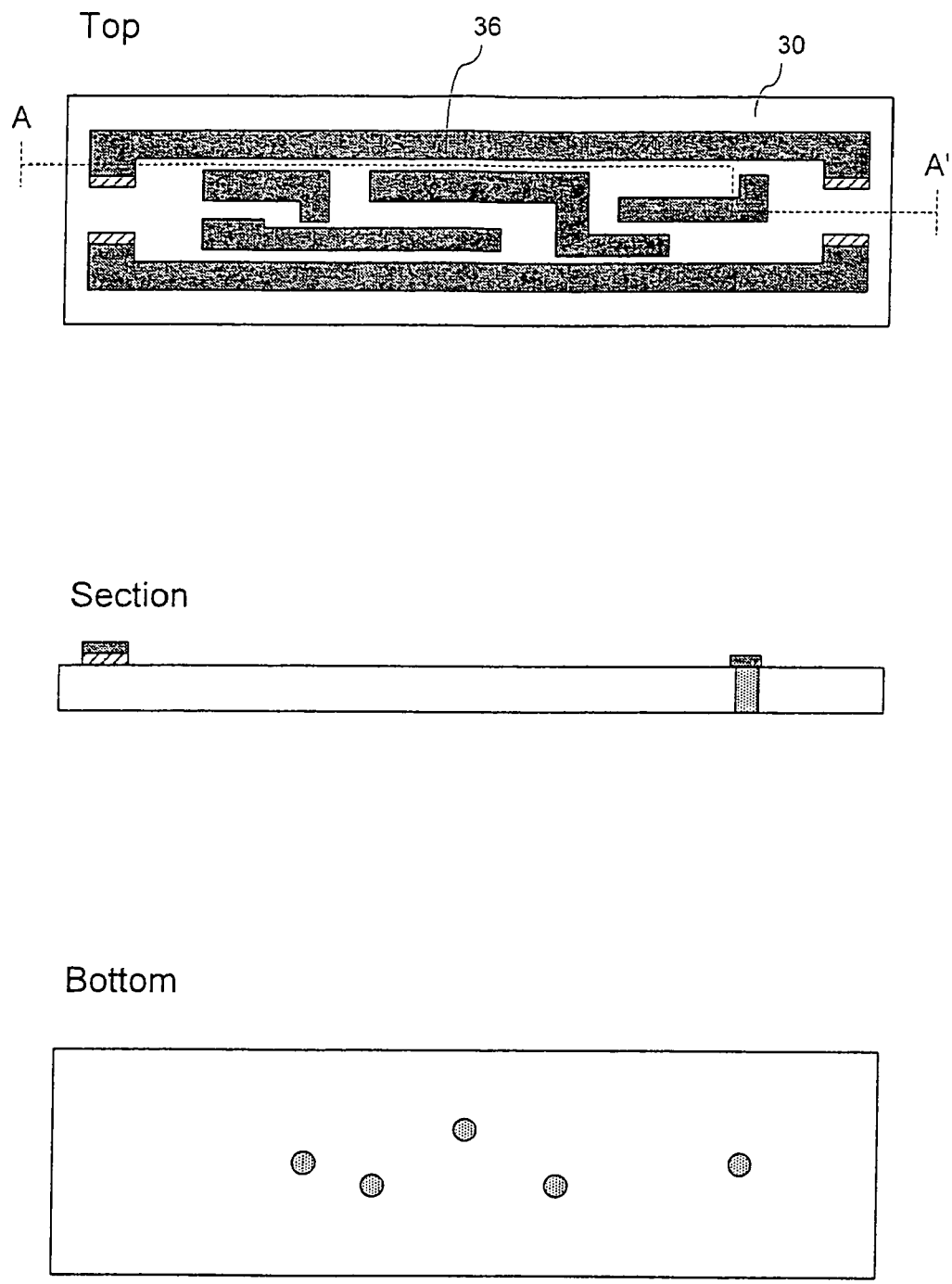

FIG. 2*c* shows the structure of FIG. 2*b* after formation of patterned conductors 36 on the top surface of the base substrate 30. The conductors 36 are preferably formed of consecutive layers of titanium, platinum and titanium that are patterned by a photoresist lift-off process. In the lift-off process, a photoresist layer is patterned to form a negative image of the conductors 36 using a conventional exposure and developing technique. A blanket metal thin film is formed over the substrate and the photoresist pattern such as by physical vapor deposition (sputtering), and a photoresist stripping chemistry is then used to remove the photoresist pattern. Metal deposited on the photoresist is lifted off as the underlying photoresist is dissolved, while metal deposited on the base substrate adheres to the base substrate and remains after lift-off. Accordingly, precise lithographically patterned thin film conductors are formed with precise alignment to the base substrate 30 and vias.

Figure 2D:
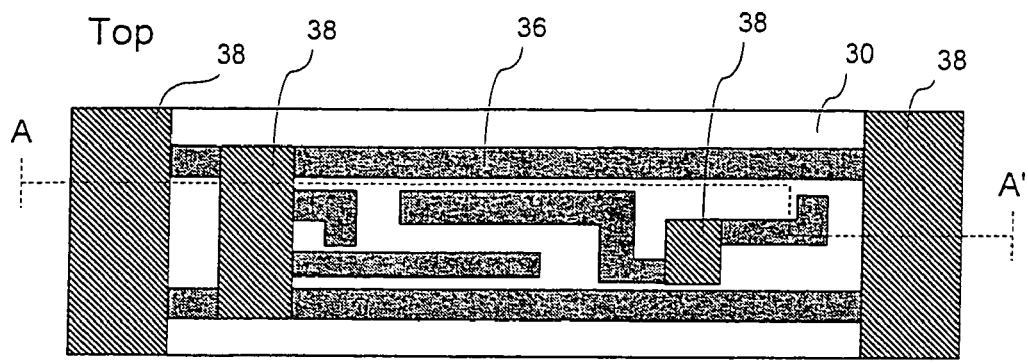
Figure 2D:
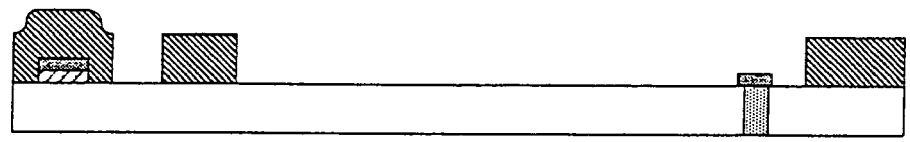
Figure 2D:
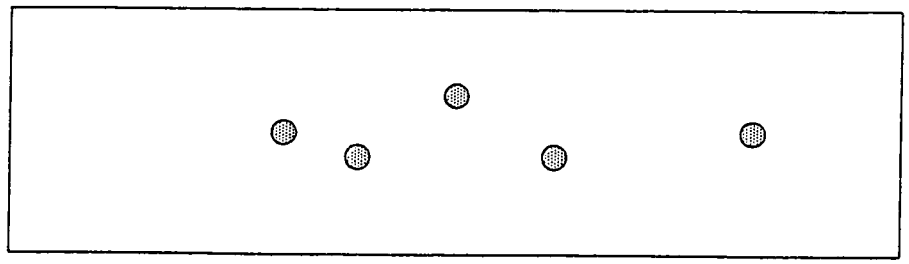

FIG. 2*d* shows the structure of FIG. 2*c* after formation of sacrificial structures 38 on the base substrate 20 and the conductors 36. The sacrificial structures 38 are used to define areas of the base substrate 30 and conductors 36 that are to be protected during subsequent deposition of a dielectric material, in a manner analogous to the use of the photoresist mask in the lift-off technique for patterning the conductors 36. The sacrificial structures 38 are preferably formed of a material that will survive subsequent vacuum deposition of dielectric and that is easily removed in later processing by a etchant that is highly selective of the sacrificial material with respect to other exposed materials. In the preferred embodiment, the sacrificial structures 38 are formed of aluminum that is deposited by a shadow mask process. In the shadow mask process, a shadow mask bearing a positive image of the sacrificial structures is placed in contact with or near the surface of the base substrate 30 and conductors 36. Aluminum is blanket deposited over the shadow mask such as by a vacuum deposition process such as sputtering, and forms on the substrate in those areas that are exposed by apertures in the shadow mask. After deposition the shadow mask is removed, leaving patterned aluminum structures 38 as shown in FIG. 2*d*. In the preferred embodiment it is preferable to form the sacrificial structures 38 to be substantially thicker than the subsequent dielectric layers that is to be patterned using the sacrificial structures 38.

Figure 2E:
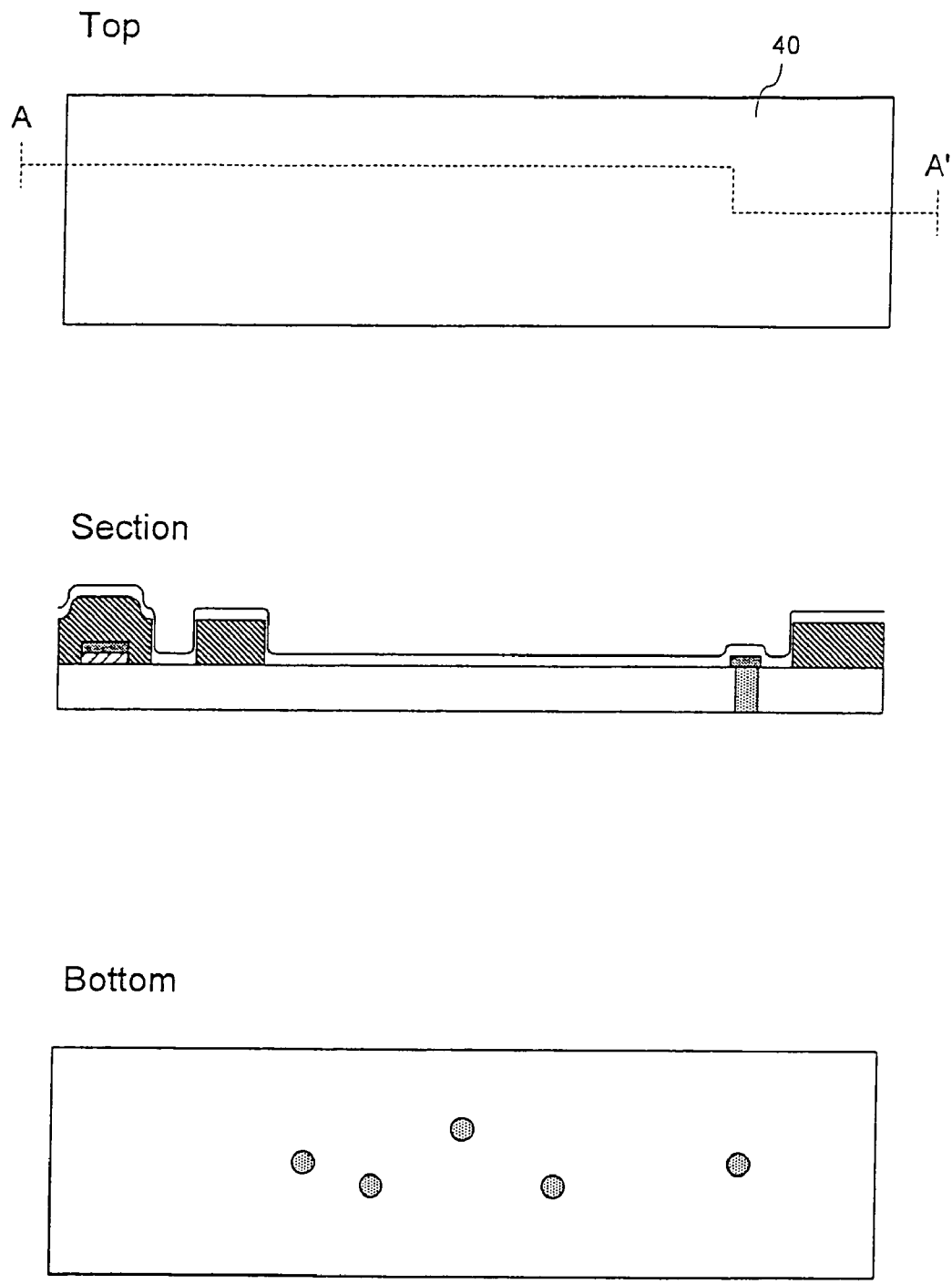

FIG. 2*e* shows the structure of FIG. 2*d* after vacuum deposition of a dielectric thin film 40 over the base substrate, the conductors and the sacrificial structures. In the preferred embodiment the dielectric material is alumina and is vacuum deposited by a method such as sputtering or evaporation, producing a highly hermetic dielectric material in an "as fired" form, that is, in a form that will not undergo significant structural changes such as shrinkage during subsequent processing. To enhance the density, adhesion and hermeticity of the dielectric thin film 40, ion beam assisted deposition (IBAD) may be employed, wherein the deposited dielectric material is bombarded with low energy ions during deposition to provide improved adhesion and coating density. Formation of dielectric thin films by vacuum deposition can produce layers having thicknesses in the range of 100 angstroms to 20 microns (0.0000004-0.0008 inches), compared to the conventional minimum green sheet thickness of 0.006 inches or approximately 150 microns. Accordingly, the use of vacuum deposited dielectric thin films rather than conventional sheet dielectrics allows the production of significantly thinner multilayer substrates or the production of multilayer substrates having significantly more layers than those formed by conventional lamination methods. In addition, vacuum deposited layers are highly hermetic and provide significant protection of underlying materials against the outside environment.

Figure 2F:
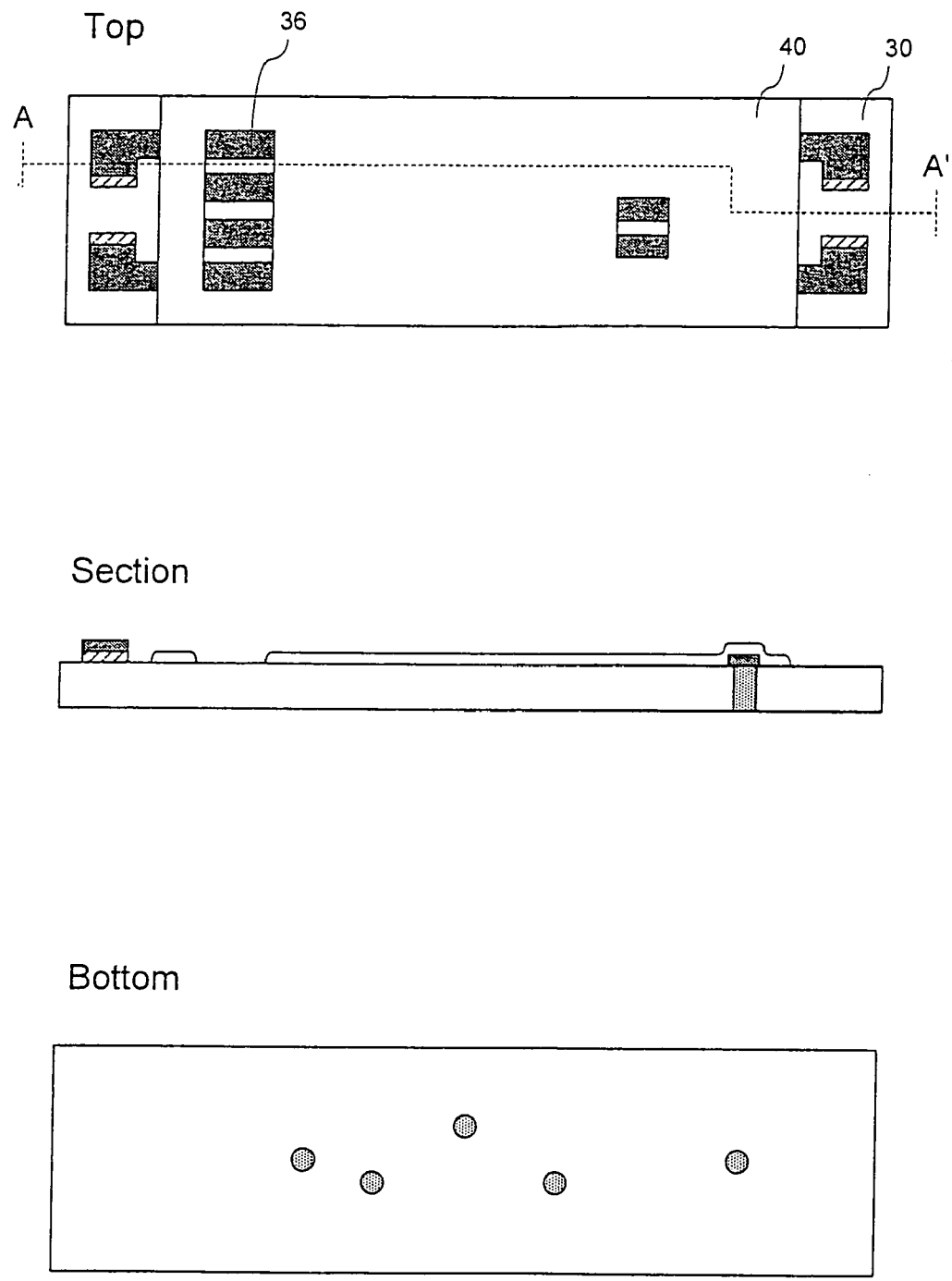

FIG. 2*f* shows the structure of FIG. 2*e* after patterning of the deposited dielectric layer 40 by selective removal of the aluminum sacrificial structures. The aluminum sacrificial structures may be removed selectively with respect to the titanium conductors, alumina base substrate and gold vias using a ferric chloride solution or another mild etchant that is selective with respect to the aluminum sacrificial structures. The etchant reaches the aluminum sacrificial structures through pin-holes and other imperfections in the extremely thin layers of dielectric material that are deposited on the sidewalls of the sacrificial structures. By forming the sacrificial structures to be substantially taller than the dielectric layer, it is ensured that there will be sufficiently thin sidewall coverage and sufficient sidewall surface area to enable penetration of the etchant. As the aluminum sacrificial structures dissolve, the dielectric thin film overlying the sacrificial structures collapses and is rinsed away in subsequent cleaning, leaving a patterned dielectric thin film as shown in FIG. 2*f* that protects the majority of the conductors 36 and base substrate 30 surface area while selectively exposing portions of the conductors 36 for connection to overlying conductors. Because the sacrificial structures 38 are precisely positioned relative to the base substrate 30 and conductors 36 using the shadow mask process described above, and because the deposited dielectric thin film 40 will not undergo significant structural changes during further processing, the openings in the deposited dielectric thin film 40 are precisely aligned with the underlying conductors 36 and base substrate 30, enabling greater via and conductor densities and providing greater process yield.

Figure 2G:
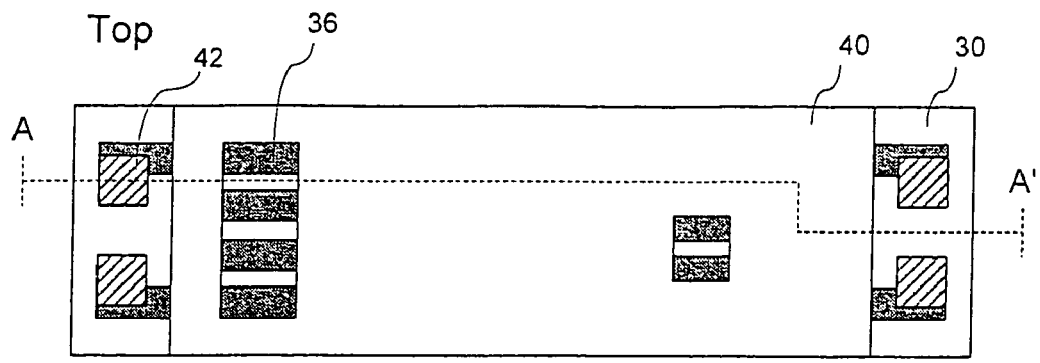
Figure 2G:
Figure 2G:
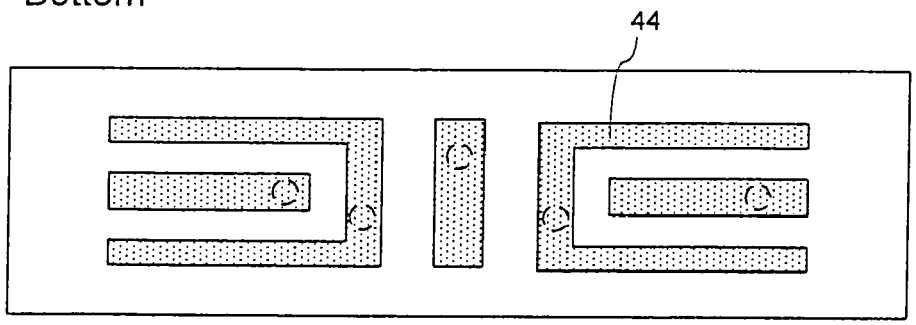

FIG. 2*g* shows the structure of FIG. 2*f* after formation of additional welding pads 42 on the top surface of the base substrate 30, followed by formation of sensor electrodes 44 on the bottom surface of the base substrate 30. The sensor electrodes 44 are preferably formed of successive thin films of titanium, platinum and titanium that are patterned on the bottom surface of the base substrate 30 by a photoresist lift-off process.

Figure 2H:
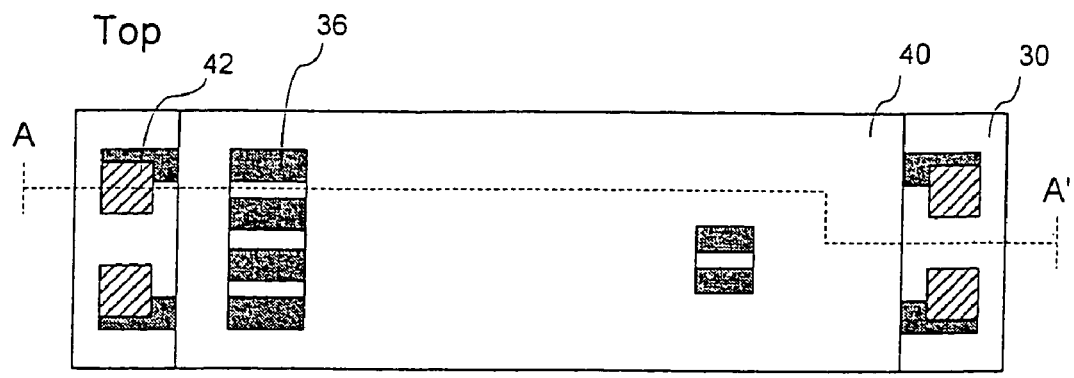
Figure 2H:
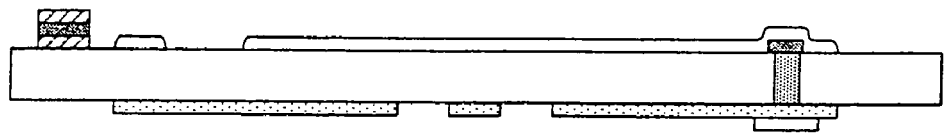
Figure 2H:
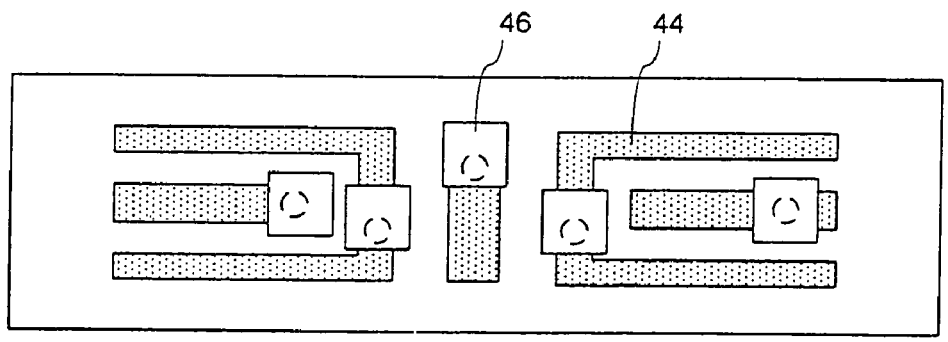

FIG. 2h shows the structure of FIG. 2g after formation of caps 46 over portions of the sensor electrodes 44 that are in contact with vias 32 that extend through the dielectric base substrate 30. The caps 46 prevent access of fluid contaminants to the vias 32 and portions of the base substrate 30 in the vicinities of the vias that may be somewhat amorphous as a result of laser drilling and therefore more susceptible to chemical degradation. In the preferred embodiment the caps 46 are highly pure alumina caps that are formed using a positive shadow mask process, thus allowing precise registration of the caps 46 to the vias 32.

Figure 2I:
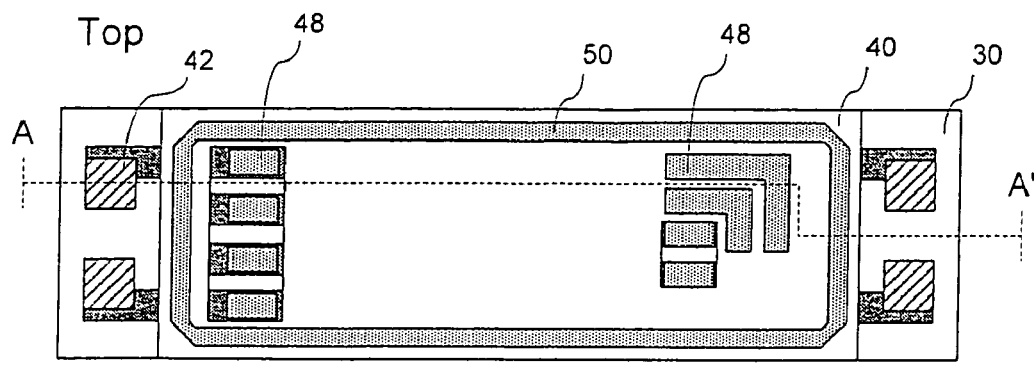
Figure 2I:
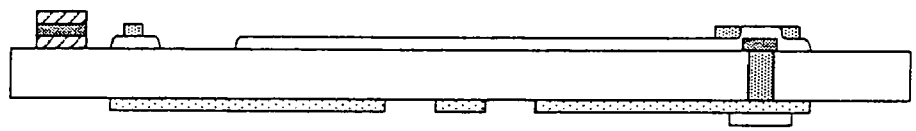
Figure 2I:
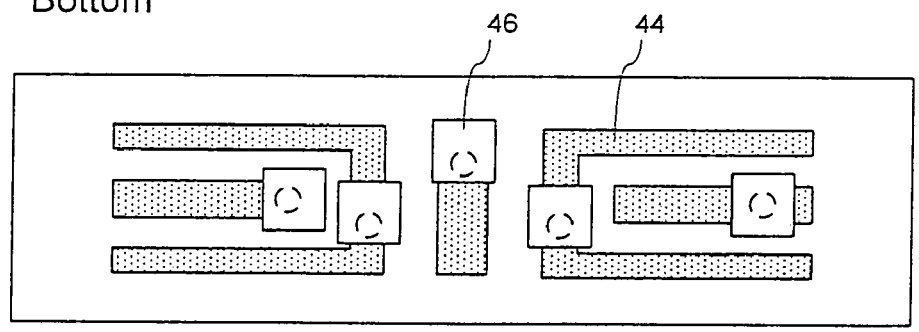

FIG. 2i shows the structure of FIG. 2h after formation of gold contact pads 48 on exposed portions of the conductors 36. The gold contact pads 48 provide contact points for electrical connection of integrated circuits and discrete devices to the conductors 36. A gold ring 50 is also formed at the perimeter of the deposited dielectric thin film 40 and defines an area within which circuit components will be mounted. The gold ring 50 is used in later processing for bonding a protective cap over the circuit components. The gold contact pads 48 and gold ring 50 are preferably formed by a photoresist lift-off process.

Figure 2J:
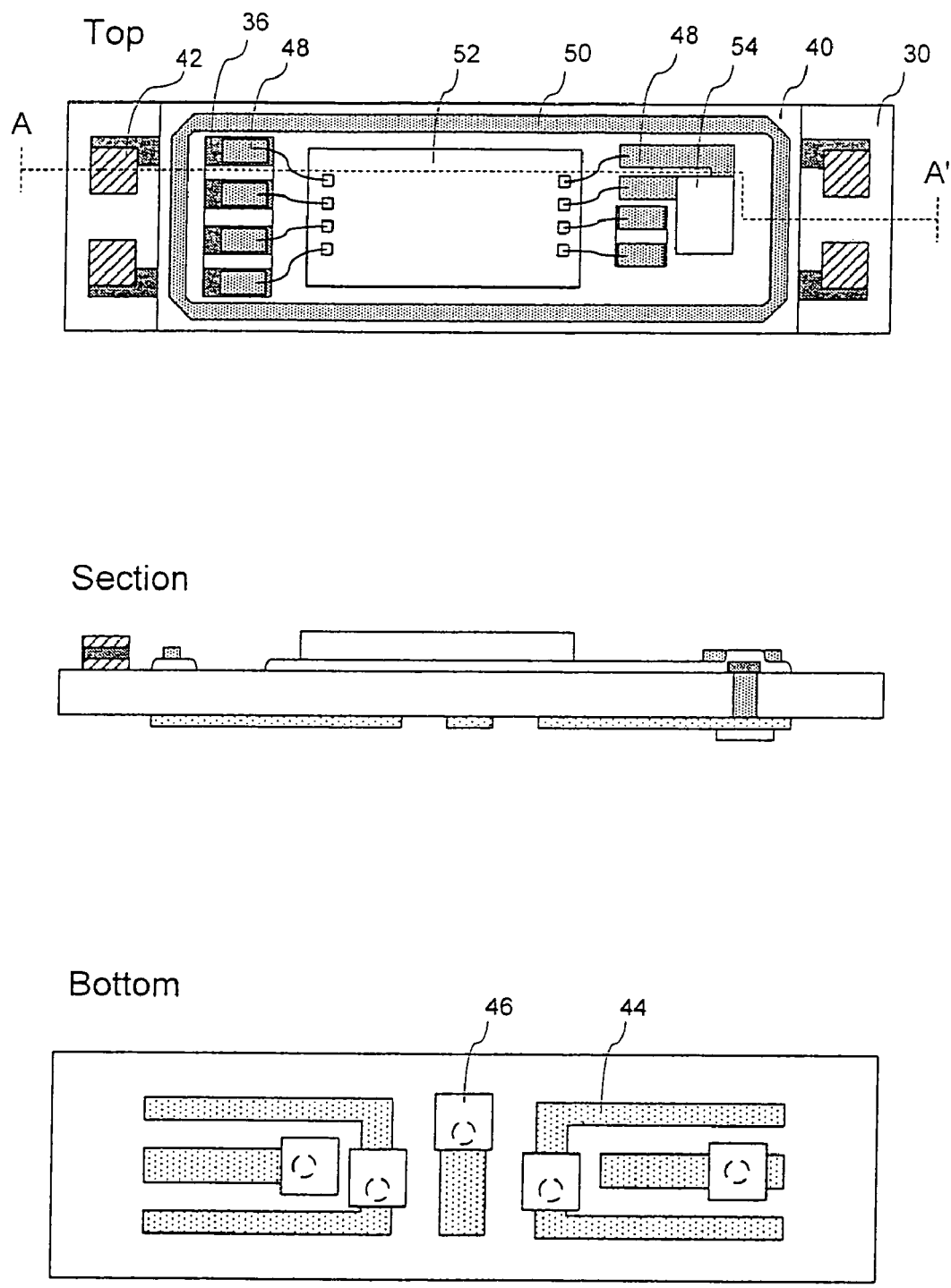

FIG. 2j shows the structure of FIG. 2i after mounting of an integrated circuit 52 and a discrete capacitor 54 to the multilayer substrate composed of the base substrate 30, the conductors 36 and the deposited dielectric thin film 40. The integrated circuit 52 is connected to the gold contact pads 48 by wire bonds. In the preferred embodiment, the integrated circuit is in electrical communication with the sensor electrodes 44 on the bottom of the base substrate 30 through the conductors 36 formed on the top surface of the base substrate 30 and the hermetic vias 32 formed through the base substrate 30. The integrated circuit 52 makes oxygen and glucosine measurements using readings taken from the sensor electrodes 44 and provides a digital output representing those measurements. While the preferred embodiment connects the integrated circuit 52 using wire bonds, in alternative other connection structures such as flip chip and ball grid array structures may be used.

Figure 2K:
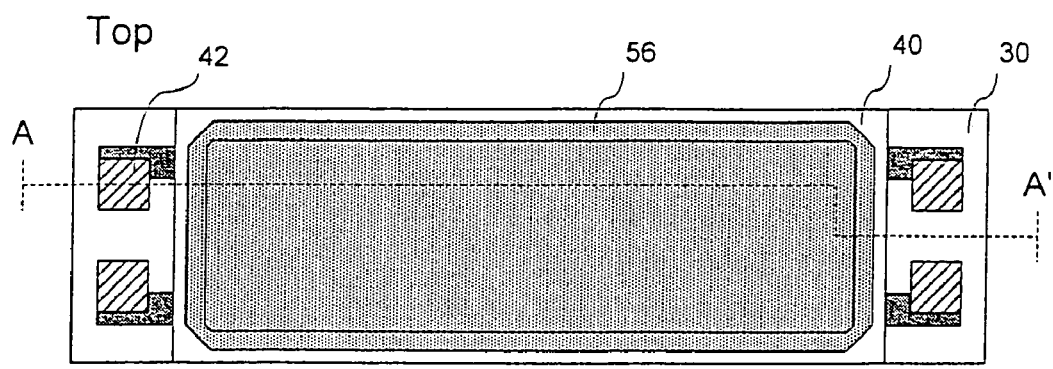
Figure 2K:
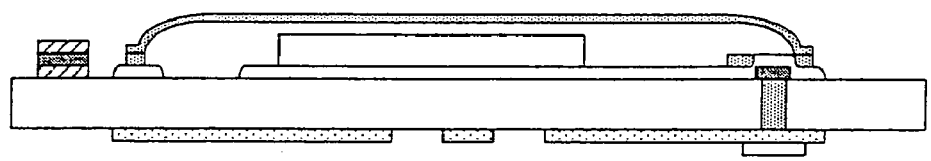
Figure 2K:
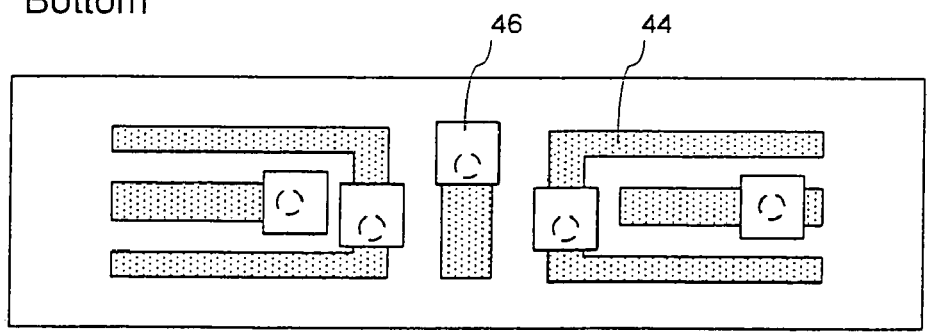

FIG. 2k shows the structure of FIG. 2j after bonding of a protective cap 56 to encase the circuit components. The cap 56 is preferably a gold cap that is bonded to the gold ring formed on the deposited dielectric thin film. In the resulting structure the protective cap 56 provides a hermetic seal against fluids at the top surface of the substrate, while the hermetic vias 32 and their associated caps 46 provide hermetic seals against fluids at the exposed bottom surface where the sensor electrodes 44 are located. The deposited dielectric thin film 40 that lies between the gold cap and the base substrate is also hermetically bonded to the base substrate 30 by virtue of its vacuum deposition, and as a result the circuit components are completely hermetically sealed against the outside environment.

While the processing shown in FIGS. 1a-1h and 2a-2k represents a preferred embodiment for producing a blood glucose monitor, the techniques used in this processing are generally applicable to a wide range of applications in which it is desired to produce thin multilayer substrates with a high degree of alignment precision, relatively little shrinkage, and a potentially high conductor and via density. Accordingly, many specific details of the preferred embodiment may be altered, adapted or eliminated to in accordance with various desired implementations.

In general terms the techniques of the preferred embodiment may be adapted to form multilayer substrates comprised of any desired number of dielectric and conductors layers. The substrate is formed of patterned dielectric and conductive thin films that are deposited on a base substrate. Deposited dielectric layers are preferably patterned using sacrificial structures to form openings in the dielectric layers for vias or for exposing larger contact areas of conductors.

The thin films use in accordance with embodiments of the invention are preferably vacuum deposited. For purposes of this disclosure, the term vacuum deposited refers deposition of a material at a low pressure in a controlled atmosphere. Such techniques include evaporation, sputtering (PVD) and chemical vapor deposition (CVD). Evaporation is preferably used where it is desired to form a relatively thick layer, e.g. 10 microns. However evaporation provides relatively poor adhesion and density. The adhesion and density of evaporated layers may be improved through the use of ion bombardment (ion-assisted evaporation). Sputtering (PVD) is preferred where adhesion is a priority. However the growth rate of layers formed by sputtering is approximately an order of magnitude slower than those formed by evaporation. CVD may be used as needed to form layers of materials that are not easily formed by evaporation or sputtering.

With regard to the base substrate, it is preferred in most embodiments to use a rigid sheet of an as-fired dielectric ceramic material. However, the base substrate may be composed of a wide variety of substrate materials since the deposition processes used to form forming dielectric and conductive thin films are performed at relatively low temperatures, and patterning of those thin films using sacrificial structures utilizes relatively mild etchants. While the preferred embodiment uses a substrate comprising 92-96% purity alumina, high purity berillia and aluminum nitride base substrates may also be used. Other types of dielectric substrates such as polyimide flex board and standard printed circuit board substrates comprised of epoxy resin impregnated glass fiber may also be used. In optical applications, substrates such as glass and sapphire may be used. For radiation hardened applications a gallium arsenide (GaAs) substrate may be used, and may be provided with a thin dielectric protective layer as required. In advanced applications, the substrate may be a semiconductor substrate such as silicon or GaAs that has an application specific integrated circuit (ASIC) formed therein by conventional lithographic techniques. Thin film dielectric and metal layers may then be formed on the semiconductor substrate in the manner of the present invention to protect the ASIC and to form sensor electrodes and metal patterns for connection of discrete components to the ASIC.

With regard to conductors, it is preferred to utilize thin film conductors that are patterned by shadow masking, photoresist lift-off patterning or chemical etching. However in alternative embodiments conductors may be formed by other methods such as screen printing. The thickness of the conductors may be selected in accordance with a type of joining operation that will be performed on the conductor. For example, conductors that will be resistance welded may be formed of a thick layer, while conductors that will be connected by a low power technique such as wire bonding may be formed of a thin film. Further, while the preferred embodiment provides conductors that are designed for wire bonding, in alternative embodiments the conductors may be patterned for use in other integrated circuit connection structures, such as flip chip and ball grid array structures. The types of conductor materials that may be used are not limited by processing conditions as in some conventional lamination methods, and may therefore be chosen in accordance with the particular application. Conductor materials may include metals such as platinum, gold, silver, copper, titanium, tungsten, and aluminum, as well as alloys, conductive compounds such as silicides, or any other conductor that is applicable in a particular implementation. While the conductors of the preferred embodiment are formed of successive layers of different conducting materials, single conducting materials may also be employed.

Embodiments of the invention also provide great freedom of choice with respect to the deposited dielectric material. As a general matter the dielectric layer should be capable of formation by a vacuum deposition technique that provides good adhesion to underlying materials and good process control for producing very thin layers. As a general matter any dielectric material that can be obtained in a substantially pure form may be evaporated and vacuum deposited as a thin film on a substrate. Accordingly, a variety of deposited dielectric materials may be used including alumina, aluminum nitride, silicon oxide, silicon nitride, silicon oxynitride, titanium nitride and the like. Vacuum deposited dielectric thin films provide a number of desirable properties, including highly controllable thickness, high hermeticity, dimensional stability, thermal and chemical stability, and tunable dielectric and thermal conductance properties. For purposes of this disclosure, the term "deposited dielectric" is therefore used not only to describe the processing by which the dielectric is formed, but also the resulting structural features of the deposited dielectric that distinguish it from conventional laminated dielectrics, including its conformality and hermeticity with respect to the materials on which it is formed, its high density and adhesion, and its dimensional, thermal and chemical stability.

Thin film dielectric layers are preferably patterned using sacrificial structures formed by shadow mask deposition. While the preferred embodiment utilized a single dielectric thin film having relatively large patterned openings, in alternative embodiments multiple layers of dielectric thin films may be employed, and the dielectric thin films may have very small patterning features such as vias for connecting conductors in adjacent layers. It is preferable to form the shadow mask apertures for small patterning features using laser drilling methods, thereby enabling the formation of vias with diameters as small as 0.002 inches and with spacings as small as 0.006 inches.

Accordingly, using conductive and dielectric thin films and patterning techniques in accordance with embodiments of the invention, the dimensions of multilayer substrate features may be significantly reduced compared to those produced through conventional lamination techniques. The following table compares the minimum dimensions and other characteristic features achievable through conventional lamination techniques and through embodiments of the present invention:

TABLE 1

|  | Conventional Lamination | Preferred Embodiment |
| --- | --- | --- |
| Minimum line width | 0.005 inches | 0.001 inches |
| Minimum dielectric thickness | 0.006 inches | 0.00004 inches |
| Minimum via diameter | 0.005 inches | 0.002 inches |
| Minimum via spacing | 0.015 inches | 0.006 inches |
| Shrinkage | in excess of 10% | none |

While the multilayer substrate of the preferred embodiment is comprised solely of vias, conductors and dielectric layers, alternative embodiments may integrate or embed passive components such as capacitors, resistors and inductors into the multilayer substrate. For example, while the circuit of the preferred embodiment comprises a discrete capacitor, in alternative embodiments a capacitor may be integrally formed in the multilayer substrate from conductors separated by a deposited dielectric layer. Capacitors may be formed, for example, using a silicon oxide or silicon nitride dielectric layer between conductive plates. Interdigitated capacitors and trench may also be formed. The degree of material control and geometrical precision provided by vacuum deposition and patterning of the dielectric layers allows for precise patterning of the capacitor structure as well as tuning of the capacitor parameters through control of the thickness and dielectric constant of the deposited dielectric layer. Thin film inductors and thin film resistors may also be integrated into the multilayer substrate. Thin film resistors may be patterned from layers of materials such as tantalum nitride (TaN), polysilicon, titanium, cermet or nichrome. In other embodiments, substrate layers may be patterned to form micro-electro-mechanical systems (MEMS) that are integrated with the layers of the substrate. For example, the patterning techniques described above can be used to fabricate structures such as microfluidic structures, valves, reaction chambers, strain gages, micro-actuators, electro-mechanical sensors arrays and optical detectors. Additional properties of the multilayer substrate such as thermal management, power management, shielding and grounding can be precisely controlled through choices of layout and materials.

A wide variety of embodiments may therefore be implemented in accordance with the invention. In general terms, multilayer circuit substrates fabricated in accordance with embodiments of the invention are characterized by a dielectric base substrate having conductors formed thereon, and at least one layer of a patterned vacuum deposited dielectric thin film overlying the conductors. In various implementations, multiple layers of conductors and dielectric thin films may be used, conductors may be formed from thin films, multiple layers may be formed on both sides of the base substrate, and the base substrate may include hermetic vias. It is preferred that the deposited dielectric thin films are patterned using sacrificial structures formed by shadow mask deposition.

Figure 3:
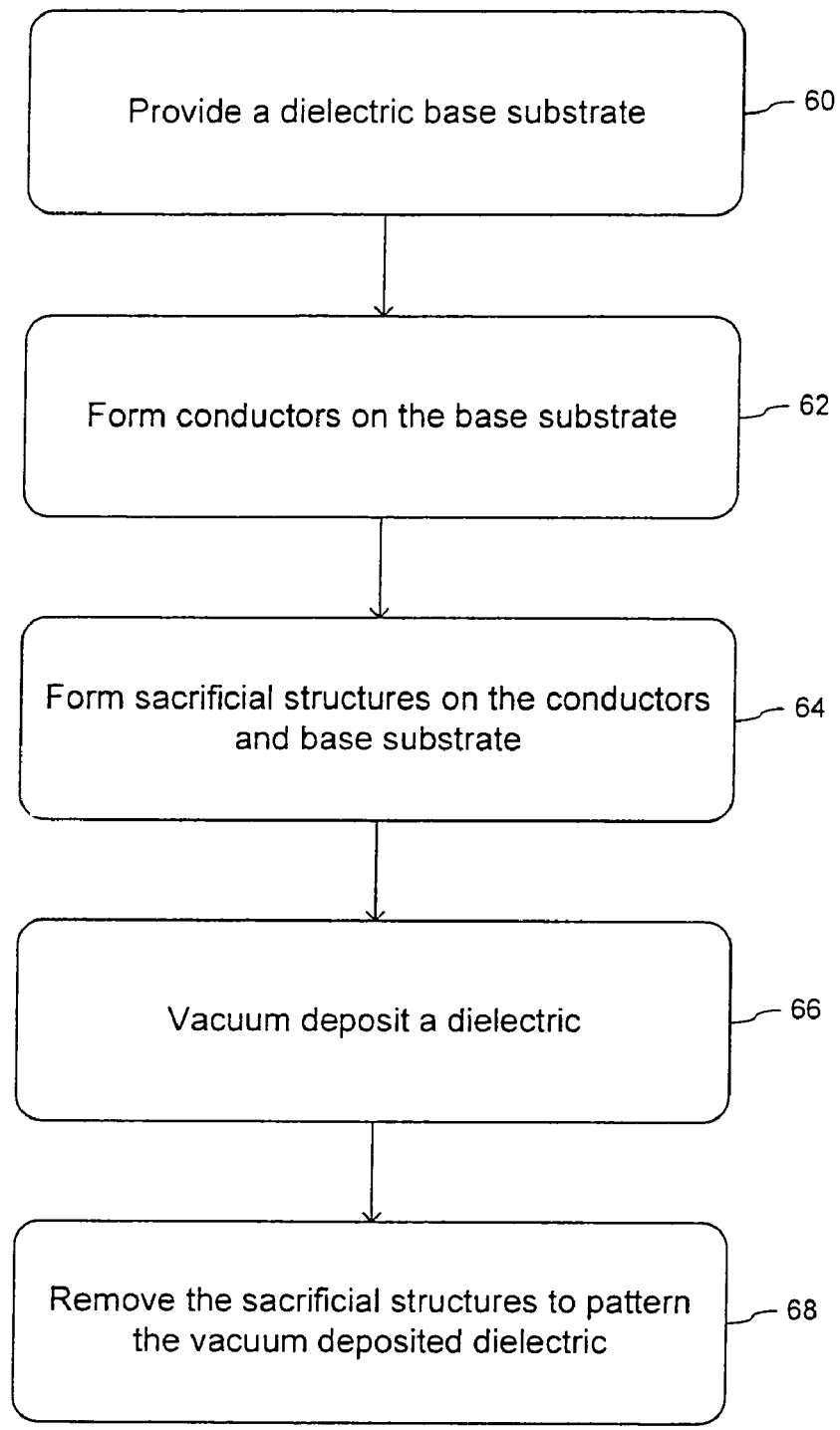
FIG. 3 shows a process flow encompassing the processing of FIGS. 2a-2k and alternative processing.

FIG. 3 shows a process flow for producing a multilayer circuit substrate that encompasses the preferred embodiment, the aforementioned alternative embodiments, and further alternatives. Initially a dielectric base substrate is provided (60). Conductors are then formed on the base substrate (62), preferably by patterning of a blanket layer of a conductive thin film deposited by a vacuum deposition method. Sacrificial structures are then formed on the base substrate and conductors (64). The sacrificial structures define areas of the base substrate and conductors that are to be protected during subsequent dielectric deposition. The sacrificial structures are preferably formed by shadow mask deposition. A dielectric thin film is then vacuum deposited on the base substrate, the conductors and the sacrificial structures (66), and the sacrificial structures are removed (68) to leave a patterned dielectric thin film on the conductors and the base substrate. Further processing such as forming additional conductor layers and dielectric layers or mounting of electronic components may be performed.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, application and removal of antireflective layers, doping, cleaning, planarization, annealing and other tasks, may be performed along with the tasks specifically described above. Further, the processes may be performed selectively on sections of a base substrate or at multiple locations on the base substrate simultaneously. Thus, while the embodiments illustrated in the figures and described above are presently preferred, it should be understood that these embodiments are offered by way of example only. The invention is not limited to a particular embodiment, but extends to various modifications, combinations, and permutations encompassed by the appended claims and their equivalents.

What is claimed is:

1. A multilayer circuit substrate, comprising:
   a dielectric base substrate;
   a conductor formed directly on a surface of the base substrate; and
   a patterned vacuum deposited dielectric thin film formed on the base substrate and the conductor; and
   wherein the thin film has a thickness of about 0.0000004 to about 0.0008 inches.

2. The structure claimed in claim 1, further comprising an electronic component mounted on the deposited dielectric thin film and electrically connected to the conductor through the deposited dielectric layer.

3. The structure claimed in claim 1, further comprising: a second conductor formed on the deposited dielectric thin film and connected to the first conductor through the deposited dielectric thin film; and a second patterned vacuum deposited dielectric thin film formed on the deposited dielectric layer and the second conductor.

4. The structure claimed in claim 3, further comprising an electronic component mounted on the second deposited dielectric thin film and electrically connected to the second conductor through the second deposited dielectric thin film.

5. The structure claimed in claim 1, wherein the base substrate comprises a hermetic via, and wherein the conductor is formed in electrical contact with the hermetic via.

6. The structure claimed in claim 1, wherein the base substrate comprises a ceramic composite.

7. A multilayer circuit substrate, comprising:
   a dielectric base substrate;
   a conductor formed on the base substrate; and
   a patterned vacuum deposited dielectric thin film formed on and in direct contact with the base substrate and the conductor; and
   wherein the thin film has a thickness about 0.0000004 to about 0.0008 inches.

8. The structure claimed in claim 7, further comprising an electronic component mounted on the deposited dielectric thin film and electrically connected to the conductor through the deposited dielectric layer.

9. The structure claimed in claim 7, further comprising:
   a second conductor formed on the deposited dielectric thin film and connected to a first conductor through the deposited dielectric thin film; and
   a second patterned vacuum deposited dielectric thin film formed on the deposited dielectric layer and the second conductor.

10. The structure claimed in claim 7, further comprising an electronic component mounted on the second deposited dielectric thin film and electrically connected to the second conductor through the second deposited dielectric thin film.

11. The structure claimed in claim 7, wherein the base substrate comprises a hermetic via; and wherein the conductor is formed in electrical contact with the hermetic via.

12. The structure claimed in claim 7, wherein the base substrate comprises a ceramic composite.

13. The structure claimed in claim 1, wherein the dielectric layer is made of alumina.

14. The structure claimed in claim 7, wherein the dielectric layer is made of alumina.

15. A multilayer circuit substrate, comprising:
   a dielectric base substrate with vias;
   a conductor formed in alignment with the via surface on the base substrate;
   a patterned vacuum deposited dielectric thin film formed in alignment with the via and the conductor such that, the vias, the conductor and the dielectric thin film remain aligned through sintering; and
   wherein the thin film has a thickness of about 0.0000004 to about 0.0008 inches.

16. The structure claimed in claim 15, further comprising an electronic component mounted on the deposited dielectric thin film and electrically connected to the conductor through the deposited dielectric layer.

17. The structure claimed in claim 15, further comprising:
   a second conductor formed on the deposited dielectric thin film and connected to a first conductor through the deposited dielectric thin film; and
   a second patterned vacuum deposited dielectric thin film formed on the deposited dielectric layer and the second conductor.

18. The structure claimed in claim 15, wherein the base substrate comprises hermetic via; and wherein the conductor is formed in electrical contact with the hermetic via.

19. The structure claimed in claim 15, wherein the base substrate comprises a ceramic composite.

* * * * *